United States Patent
Kyogoku (10) Patent No.: US 7,729,399 B2
(45) Date of Patent: Jun. 1, 2010

(54) SEMICONDUCTOR LASER DRIVING CIRCUIT LESS SUSCEPTIBLE TO NOISE INTERFERENCE

(75) Inventor: Hiroaki Kyogoku, Hyogo-ken (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 11/453,927

(22) Filed: Jun. 16, 2006

(65) Prior Publication Data
US 2006/0285564 A1 Dec. 21, 2006

(30) Foreign Application Priority Data
Jun. 17, 2005 (JP) .............................. 2005-178071

(51) Int. Cl.
*H01S 5/0683* (2006.01)
(52) U.S. Cl. .............. 372/38.01; 372/38.02; 372/38.07; 372/38.08
(58) Field of Classification Search .............. 372/38.02, 372/38.01, 38.07, 38.08; 330/241
See application file for complete search history.

(56) References Cited

U.S. PATENT DOCUMENTS

| | | | | |
|---|---|---|---|---|
| 4,987,379 A | * | 1/1991 | Hughes | 330/253 |
| 6,320,890 B1 | * | 11/2001 | Taguchi | 372/38.02 |
| 6,504,376 B2 | * | 1/2003 | Werner, Jr. | 324/458 |
| 6,930,549 B2 | * | 8/2005 | Kajiwara et al. | 330/254 |
| 2006/0088070 A1 | * | 4/2006 | Kyougoku et al. | 372/38.02 |
| 2006/0227828 A1 | * | 10/2006 | Rees et al. | 372/38.02 |

FOREIGN PATENT DOCUMENTS

JP 3332916 B2 7/2002

* cited by examiner

*Primary Examiner*—Minsun Harvey
*Assistant Examiner*—Michael Carter
(74) *Attorney, Agent, or Firm*—Dickstein Shapiro LLP (57) ABSTRACT

A laser driving circuit configured to drive a semiconductor laser diode, which is less susceptible to noise interference and capable of achieving the control of laser light intensity with high accuracy. Respective circuit components in the laser driving circuit such as an amplifier circuit, a sample hold circuit, a voltage-to-current converter, and a switching circuit are all integrated into an integrated circuit. A capacitor included in the sample hold circuit is further provided as built-in in the integrated circuit, which is previously attached externally. In addition, by changing the resistance of a resistor which is externally connected between the bias current setting terminal of the amplifier circuit and the ground potential by way of a terminal of the integrated circuit, the current outputting capability of the amplifier circuit can be variably adjusted through the adjustment of the charging time of the capacitor. As a result, the response speed of a feedback control loop for controlling the light intensity of laser diode can be increased with less noise interference and high accuracy.

13 Claims, 5 Drawing Sheets

SEMICONDUCTOR LASER DRIVING CIRCUIT LESS SUSCEPTIBLE TO NOISE INTERFERENCE

CLAIM FOR PRIORITY

This patent application claims priority to and is based on Japanese Patent Application No. JP2005-178071 filed on Jun. 17, 2005 in the Japan Patent Office, the entire contents of which are incorporated by reference herein.

FIELD OF THE INVENTION

The invention generally relates to laser driving circuits, and more specifically to a laser driving circuit configured to drive a semiconductor laser diode, which is less susceptible to noise interference and capable of achieving the control of laser light intensity with high accuracy.

BACKGROUND OF THE INVENTION

Figure 5:
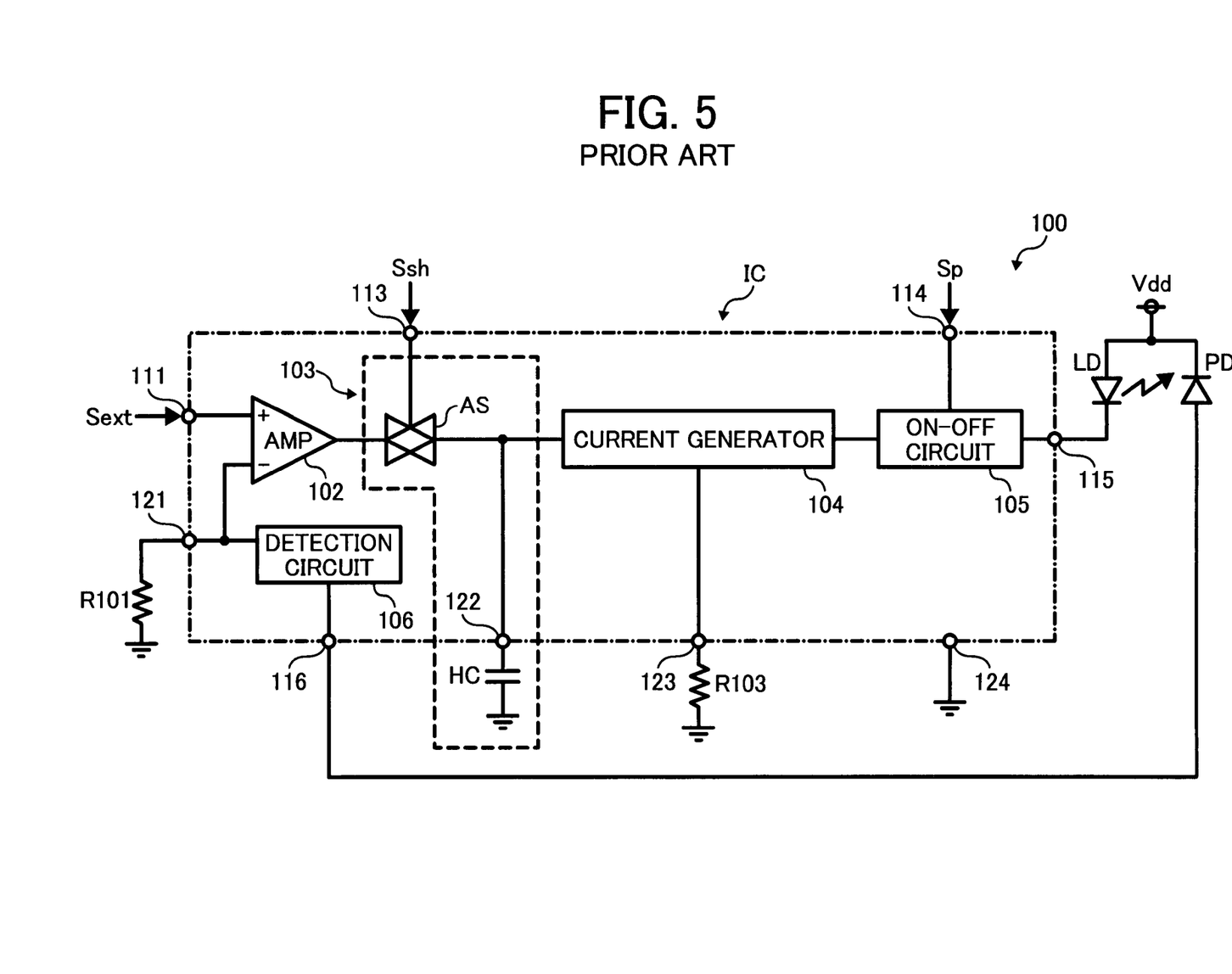
FIG. 5 is a diagrammatic block diagram illustrating the configuration of a known semiconductor laser driving circuit.

A variety of semiconductor laser driving circuits are known previously by including one illustrated in FIG. 5 for controlling the intensity of light emitted from a laser diode used in an image-forming apparatus. (Japanese Patent No. 3332916, for example.)

Referring to FIG. 5, a semiconductor laser driving circuit 100 is configured to drive a laser diode LD such that the intensity of light emitted therefrom reaches a predetermined value.

The semiconductor laser driving circuit 100 includes at least a photodiode PD, an amplifier circuit 102, a sample hold circuit 103, a current generator 104, an on-off circuit 105, a detection circuit 106, and resistors R101 and R103.

The amplifier circuit 102, sample hold circuit 103, current generator 104, on-off circuit 105, and detection circuit 106 are all integrated into one single integrated circuit (IC).

In the amplifier circuit 102, an external signal Sext is inputted to the non-inverting terminal and an output signal from the detection circuit 106 is inputted to the inverting terminal. In addition, an output signal from the amplifier circuit 102 is outputted to the sample hold circuit 103.

The anode of the photodiode PD is connected to the input terminal of the detection circuit 106 and a photocurrent generated by the photodiode PD is inputted to the input terminal.

The output terminal of the detection circuit 106 is connected to the non-inverting terminal of the amplifier circuit 102, and to the R101 which operates to convert the photocurrent into a voltage.

In addition, the sample hold circuit 103 consists of an analog switch AS and a capacitor HC, and a sample hold signal Ssh is inputted to the control electrode of the analog switch AS.

The sample hold signal Ssh is configured to turn on the analog switch AS to be electrically continuous, only when the on-off circuit 105 is switched on by an image signal Sp.

When the analog switch AS is turned on, the capacitor HC is charged by the output voltage from the amplifier circuit 102.

In contrast, when the analog switch AS is turned off, the capacitor HC is charged by the output voltage from the amplifier circuit 102 to be held as a charged voltage of the capacitor HC.

The current generator 104 is configured to generate a current to be proportional to a sample-held voltage, or the voltage caused by the charge in the capacitor HC. This current serves as a driving current for the laser diode LD.

The constant for the proportionality of current-to-voltage conversion is determined by the resistor 103 which is connected between the terminal 123 and the ground.

The switching circuit 6 is configured to be on-off controlled according to the inputted image signal Sp so as to intermittently supply the current outputted from the current generator 104 to the laser diode.

Therefore, in the semiconductor laser driving circuit 100 previously known, the capacitor HC for the sample hold circuit 103 is externally provided and the response time for light intensity control in the feedback control loop is adjusted by suitably selecting the capacitance value for the capacitor HC Japanese Patent No. 3332916).

Because of the capacitor HC externally connected to IC, a difficulty encountered in the previous laser driving circuit is that the point of grounding IC cannot be placed in close vicinity of that of the capacitor HC, and that, as a result, a slight difference in ground potential arises due to the current flowing through grounded circuits from one grounding point to another, which may be notable particularly in the laser driving circuit dealing with pulse currents.

In addition, considerable noises tend to be generated both inside and outside IC. The IC terminals, to which external devices are connected, may be affected by various interferences with relative ease through parasitic capacitances derived between groundings, power sources, and signal conductors.

As a result, driving currents for the laser diode unduly fluctuate and the control of light intensity cannot be carried out with satisfactory accuracy in the previous laser driving circuit.

It is therefore desirable to provide a semiconductor laser driving circuit having improved capability of controlling laser light intensity with satisfactory accuracy.

BRIEF SUMMARY OF THE INVENTION

Accordingly, it is an object of the invention to provide a semiconductor laser driving circuit having most, if not all, of the advantages and features of similarly employed circuits, while reducing or eliminating many of the aforementioned disadvantages.

It is another object to provide a laser driving circuit configured to drive a semiconductor laser diode, which is less susceptible to noise interference and capable of achieving the control of laser light intensity with high accuracy.

The following description is a synopsis of only selected features and attributes of the present disclosure. A more complete description thereof is found below in the section entitled "Description of the Preferred Embodiments."

The above and other objects of the invention are achieved by providing a semiconductor laser driving circuit configured to convert a laser light emitted from a semiconductor laser into a first current by a light receiving element, control a second current supplied to the semiconductor laser such that a first voltage corresponding to the first current reaches a predetermined voltage, and drive the semiconductor laser by controlling the voltage such that light intensity reaches a predetermined intensity; comprising an amplifier circuit configured to amplify a voltage difference between the voltage and a light intensity setting signal inputted from outside for setting a second intensity of the semiconductor laser, a sample hold circuit configured to hold a first output voltage from the amplifier circuit according to a first control signal inputted from outside, a voltage-to-current converter configured to convert a second output voltage outputted from the voltage-to-current converter into a third electrical current, and a switching circuit configured to perform a supply control of the third current to the semiconductor laser according to a second control signal inputted from outside, in which the sample hold circuit comprises a capacitor configured to hold a fourth current charged by a third output voltage from the amplifier circuit, and the amplifier circuit has a current outputting capability of adjustably changing a charging time of the capacitor according to a preset value and a response speed of a feedback control loop with respect to the semiconductor laser.

The semiconductor laser driving circuit further includes a current-to-voltage converter configured to convert the first current outputted from the light receiving element into a second voltage and output the second voltage to the amplifier circuit, in which the light receiving element is a photodiode configured to output the first current according to the light intensity received by the photodiode.

The semiconductor laser driving circuit further includes a detection circuit configured to detect the first current such that the terminal voltage of the photodiode remains a predetermined value even after the change of the first current, and that the second voltage outputted by the current-to-voltage converter is brought to be equal to the second voltage based on the predetermined value.

In addition, the amplifier circuit, sample hold circuit, voltage-to-current converter, and switching circuit are all integrated into a first integrated circuit, and the first integrated circuit is provided with a setting terminal for accepting a setting of the bias current such that the bias current is variably adjusted according to either the resistance of a resistor externally connected to the setting terminal, or a second current supplied by a current source externally connected to the setting terminal.

Still in addition, the amplifier circuit, sample hold circuit, voltage-to-current converter, switching circuit, and detection circuit are all integrated into a second integrated circuit, and the second integrated circuit is provided with a setting terminal for accepting a setting of the bias current such that the bias current is variably adjusted according to either the resistance of a resistor externally connected to the setting terminal, or a second current supplied by a current source externally connected to the setting terminal.

These and other features and advantages of the invention will be more clearly seen from the following detailed description of the invention which is provided in connection with the accompanying drawings.

BRIEF DESCRIPTION OF THE DRAWINGS

In the following drawings, like reference numerals will be used to refer to like elements, in which.

DETAILED DESCRIPTION OF THE INVENTION

In the detailed description which follows, specific embodiments are described on a semiconductor laser driving circuit configured to drive a semiconductor laser diode, which is less susceptible to noise interference.

It is understood, however, that the present disclosure is not limited to these embodiments. For example, it is appreciated that the present driving circuit may also be adaptable to a variety of other devices. Other embodiments will be apparent to those skilled in the art upon reading the following description.

In addition, in the description that follows specific terminology is used in many instances for the sake of clarity. However, the disclosure of this patent specification is not intended to be limited to the specific terminology so selected and it is to be understood that each specific element includes all technical equivalents that operate in a similar manner.

According to a general example in the present disclosure, there provided is a semiconductor laser driving circuit configured to convert a laser light emitted from a semiconductor laser into a first current by a light receiving element, control a second current supplied to the semiconductor laser such that a first voltage corresponding to the first current reaches a predetermined voltage, and drive the semiconductor laser by controlling the voltage such that light intensity reaches a predetermined intensity.

The semiconductor laser driving circuit includes an amplifier circuit, a sample hold circuit, a voltage-to-current converter, and a switching circuit.

The amplifier circuit is configured to amplify a voltage difference between the voltage and a light intensity setting signal inputted from outside for setting a second intensity of the semiconductor laser, the sample hold circuit is configured to hold a first output voltage from the amplifier circuit according to a first control signal inputted from outside, the voltage-to-current converter is configured to convert a second output voltage outputted from the voltage-to-current converter into a third electrical current, and the switching circuit is configured to perform a supply control of the third current to the semiconductor laser according to a second control signal inputted from outside.

In addition, the sample hold circuit includes a capacitor configured to hold a fourth current charged by a third output voltage from the amplifier circuit, and the amplifier circuit has a current outputting capability of adjustably changing a charging time of the capacitor according to a preset value and a response speed of a feedback control loop with respect to the semiconductor laser.

Specifically, the amplifier circuit is configured to set the current outputting capability thereof by adjustably changing a bias current.

In addition, the laser driving circuit further includes a current-to-voltage converter configured to convert the first current outputted from the light receiving element into a second voltage and output the second voltage to the amplifier circuit, in which the light receiving element is a photodiode configured to output the first current according to the light intensity received by the photodiode.

Still in addition, the laser driving circuit further includes a detection circuit configured to detect the first current such that the terminal voltage of the photodiode remains a predetermined value even after the change of the first current, and that the second voltage outputted by the current-to-voltage converter is brought to be equal to the second voltage based on the predetermined value.

The amplifier circuit, sample hold circuit, voltage-to-current converter, and switching circuit are all integrated into a first integrated circuit.

The first integrated circuit is provided with a setting terminal for accepting a setting of the bias current such that the bias current is variably adjusted according to the resistance of a resistor externally connected to the setting terminal.

Alternatively, the bias current may variably be adjusted according to a second current supplied by a current source externally connected to the setting terminal.

In another embodiment, the amplifier circuit, sample hold circuit, voltage-to-current converter, switching circuit, and detection circuit are all integrated into a second integrated circuit.

The second integrated circuit is provided with a setting terminal for accepting a setting of the bias current such that the bias current is variably adjusted according to the resistance of a resistor externally connected to the setting terminal.

Alternatively, the bias current may variably be adjusted according to a second current supplied by a current source externally connected to the setting terminal.

Having described the present disclosure in general, several preferred embodiments of the laser driving circuit will be described herein below according to the present invention in reference to FIGS. 1 through 4.

First Embodiment

Figure 1:
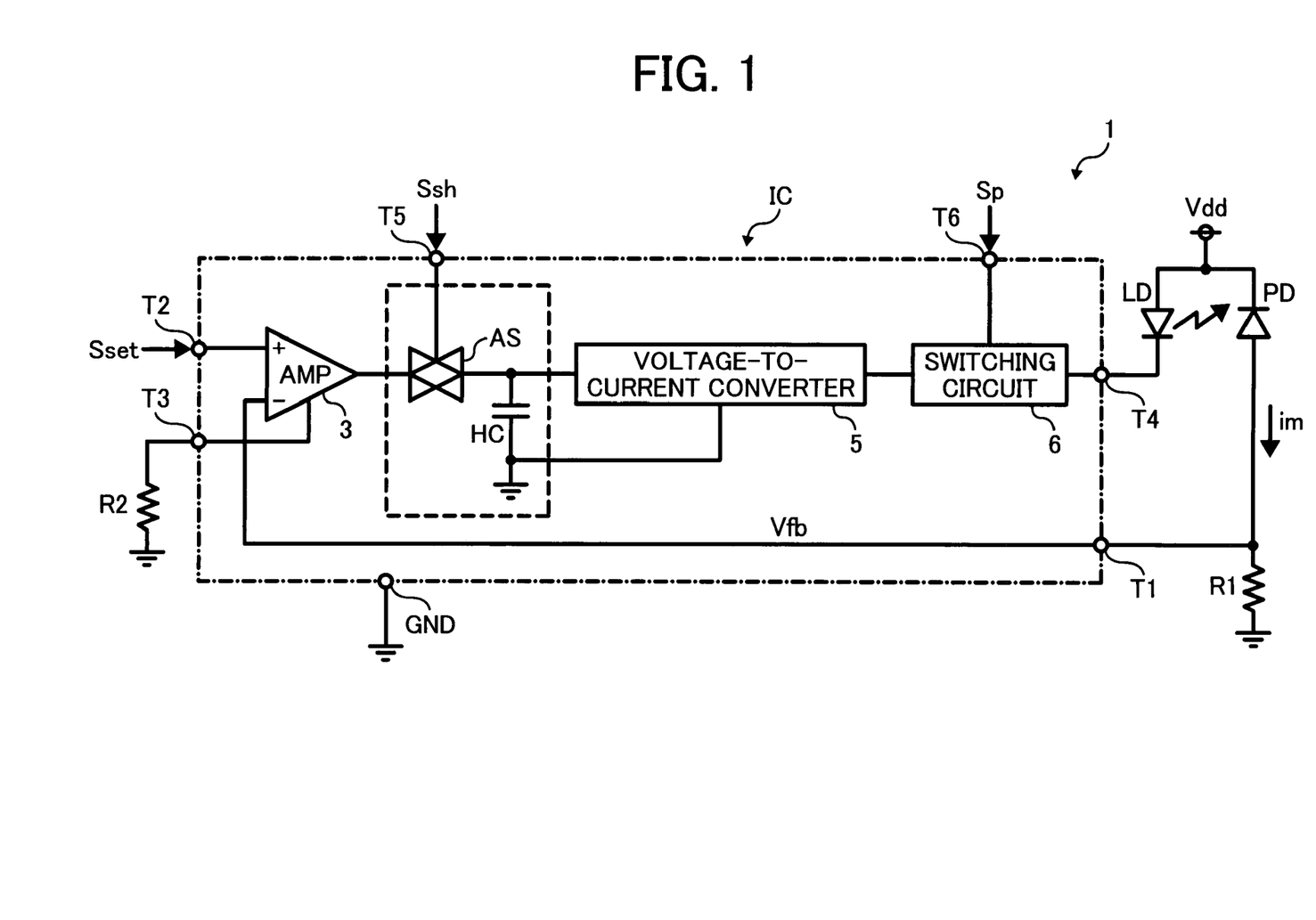
FIG. 1 is a diagrammatic block diagram illustrating the configuration of a semiconductor laser driving circuit according to one embodiment of the invention.

FIG. 1 is a diagrammatic block diagram illustrating the configuration of a semiconductor laser driving circuit according to a first embodiment of the invention.

Referring to FIG. 1, a semiconductor laser driving circuit 1 is configured to drive a laser diode LD such that the intensity of light emitted therefrom reaches a predetermined value.

The semiconductor laser driving circuit 1 includes at least a photodiode PD, an amplifier circuit 3, a sample hold circuit 4, a voltage-to-current converter 5, a switching circuit 6, and resistors R1 and R2.

The sample hold circuit 4 consists of an analog switch AS and a sample hold capacitor (hereinafter referred to as capacitor) HC. In addition, the amplifier circuit 3, sample hold circuit 4, voltage-to-current converter 5, and switching circuit 6 are all integrated into one single integrated circuit (IC).

Incidentally, the resistors R1 serves as a current-to-voltage converter.

The cathode of the photodiode PD is connected to a source voltage Vdd and the resistor R1 is connected between the anode of the photodiode PD and the ground potential.

The junction of the photodiode PD and the resistor R1 is connected to the inverting terminal of the amplifier circuit 3.

A light intensity setting signal Sset from outside is inputted to the non-inverting terminal of the amplifier circuit 3 by way of the terminal T1 of IC.

The resistor R2 is connected between the bias current setting terminal for setting a bias current of the amplifier circuit 3 and the ground potential by way of T3 terminal of IC.

The output terminal of the amplifier circuit 3 is connected to the input terminal of the voltage-to-current converter 5 by way of the analog switch AS, and the output terminal of the converter 5 is connected to the input terminal of the switching circuit 6.

The capacitor HC is connected between the junction of the analog switch AS and the voltage-to-current converter 5, and the ground potential.

The anode of the laser diode LD is connected to the source voltage Vdd, while the cathode thereof is connected to the switching circuit 6 by way of the T4 terminal of IC.

In addition, there are inputted a sample hold signal Ssh as a control signal into the control electrode of the analog switch AS by way of the T5 terminal of IC, and an image signal Sp for controlling the switching process into the switching circuit 6 by way of the T6 terminal of IC, respectively.

Incidentally, the terminal T3 serves as a setting terminal, the sample hold signal Ssh as a first control signal, and the image signal Sp as a second control signal.

In the abovementioned configuration, the photodiode PD is situated in the vicinity of the laser diode LD so as to receive a light beam emitted therefrom and generate a photocurrent im the magnitude of which is proportional to the intensity of the light beam.

The resistor R1 is configured to convert the photocurrent im into a voltage Vfb, and the amplifier circuit 3 is configured to amplify the difference between the light intensity setting signal Sset and the voltage Vfb.

Since the voltage Vfb is proportional to the photocurrent im, the output from the amplifier circuit 3 is obtained as the value resulted from the amplification of the difference in light intensity between one specified by the light intensity setting signal Sset and the other specified by the voltage Vfb.

The sample hold signal Ssh operates to switch on the analog switch AS included in the sample hold circuit 4 only during the turn-on period of laser diode LD so that the capacitor HC is charged by the output voltage from the amplifier circuit 3, and otherwise to switch the switch AS off so as for the output voltage from the amplifier circuit 3 to be held as a voltage of the capacitor HC.

The voltage-to-current converter 5 is configured to convert the voltage, which is sample-held by the sample hold circuit 4, into a current to serve as a laser driving current.

The switching circuit 6 is configured to be on-off controlled according to the image signal Sp.

When the switching circuit 6 is turned on, the current converted by the voltage-to-current converter 5 is supplied so that the laser diode LD emits light. When the circuit 6 is turned on, in contrast, the current supply is ceased so that the laser diode LD is turned off.

With the decrease in the light intensity of laser diode LD, the voltage drop through the resistor R1 decreases, the output voltage of the amplifier circuit 3 increases, and the current for driving the laser diode LD increases, whereby the light intensity of the laser diode LD increases.

By contrast, with the increase in the light intensity, the voltage drop through the resistor R1 increases, the output voltage of the circuit 3 decreases, and the current for driving LD decreases, whereby the light intensity of the laser LD decreases.

By performing these steps repeatedly the light intensity of the laser diode LD can be controlled to achieve the light intensity corresponding to the light intensity setting signal Sset.

Figure 2:
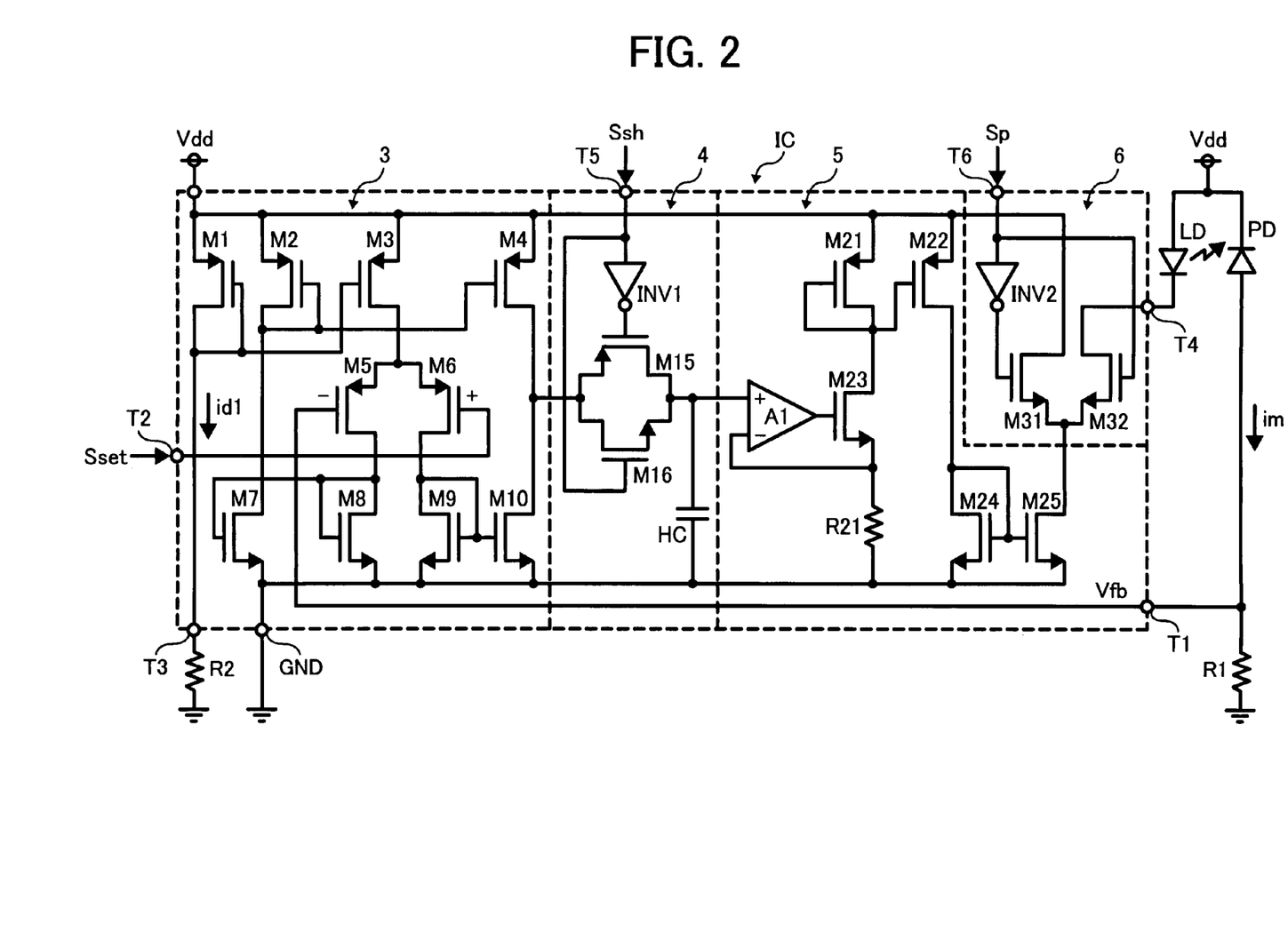
FIG. 2 illustrates certain construction details of respective portions of FIG. 1.

FIG. 2 illustrates certain construction details of respective portions of FIG. 1.

Referring to FIG. 2, the amplifier circuit 3 comprises PMOS transistors M1 through M6 and NMOS transistors M7 through M10, and PMOS transistors M5 and M6 are configured to form a differential pair.

The sources of PMOS transistors M5 and M6 are interconnected. In addition, PMOS transistor M3 is connected between the source voltage Vdd and the junction of the sources of PMOS transistors M5 and M6.

PMOS transistors M1 and M3 form a first current mirror circuit, the gates of the PMOS transistors M1 and M3 are interconnected, and the junction of the gates is connected to the drain of PMOS transistor M1. In addition, the drain of the PMOS transistor M1 is connected to the T3 terminal, and the resistor R2 is connected between the T3 terminal and the ground potential.

The gate of PMOS transistor M5 serves as the inverting terminal of the amplifier circuit 3, NMOS transistor M8 is connected between the drain of the PMOS transistor M5 and the GND terminal of IC, and the GND terminal is connected to the ground potential.

NMOS transistors M7 and M8 form a second current mirror circuit, the gates of the NMOS transistors M7 and M8 are interconnected, and the junction of the gates is connected to the drain of NMOS transistor M8.

The sources of NMOS transistors M7 and M8 are respectively connected to the GND terminal of IC, and the drain of NMOS transistor M7 is connected to the drain of PMOS transistor M2.

PMOS transistors M2 and M4 form a third current mirror circuit, the gates of the PMOS transistors M2 and M4 are interconnected, and the junction of the gates is connected to the drain of PMOS transistor M2.

The gate of PMOS transistor M6 serves as the non-inverting terminal of the amplifier circuit 3, and NMOS transistor M9 is connected between the drain of the PMOS transistor M6 and the GND terminal of IC.

NMOS transistors M9 and M10 form a fourth current mirror circuit, the gates of the NMOS transistors M9 and M10 are interconnected, and the junction of these gates is connected to the drain of NMOS transistor M9.

The sources of NMOS transistors M9 and M10 are respectively connected to the GND terminal, and the drain of NMOS transistor M10 is connected to the drain of PMOS transistor M4, and the junction of these drains serves as the output terminal of the amplifier circuit 3.

The analog switch AS includes PMOS transistor M15, NMOS transistor M16, and an inverter INV1.

The source of the PMOS transistor M15 is connected to the drain of NMOS transistor M16, and the output terminal of the amplifier circuit 3 is connected to the junction of the source of the PMOS transistor M15 and the drain of NMOS transistor M16.

In addition, the drain of PMOS transistor M5 is connected to the source of NMOS transistor M16, and the capacitor HC is connected between the junction of the drain of PMOS transistor M5 and the source of NMOS transistor M16, and the GND terminal.

There connected to the terminal T5 are the input terminal of the inverter INV1 and the gate of NMOS transistor M16, while the output terminal of the inverter INV1 is connected to the gate of PMOS transistor M15.

In the next place, the voltage-to-current converter 5 is formed by including an operational amplifier A1, PMOS transistors M21 and M22, NMOS transistors M23 through M25, and a resistor R21.

The non-inverting of the operational amplifier A1 is connected to the junction of the drain of PMOS transistor M15, the source of NMOS transistor M16, and the capacitor HC.

The output terminal of the operational amplifier A1 is connected to the gate of NMOS transistor M23. The resistor R21 is connected between the source of the NMOS transistor M23 and the GND terminal, and the junction of the source of the NMOS transistor M23 and the GND terminal is connected to the inverting terminal of the operational amplifier A1.

PMOS transistors M21 and M22 form a fifth current mirror circuit, the gates of the PMOS transistors M21 and M22 are interconnected, and the junction of these gates is connected to the drain of PMOS transistor M21.

The drain of PMOS transistor M22 is connected to the drain of NMOS transistor M24, and the NMOS transistor M24 with NMOS transistor M25 forms a sixth current mirror circuit. The gates of the NMOS transistors M24 and M25 are interconnected, and the junction of these gates is connected to the drain of NMOS transistor M24.

The sources of NMOS transistors M24 and M25 are respectively connected to the GND terminal, and the drain of NMOS transistor M25 serves as the output terminal of the voltage-to-current converter 5.

The switching circuit 6 is formed by including an inverter INV2 and NMOS transistors M31 and M32.

There connected to the terminal T6 are the input terminal of the inverter INV2 and the gate of NMOS transistor M32, while the output terminal of the inverter INV2 is connected to the gate of NMOS transistor M31.

The drain of the NMOS transistor M31 is connected to the source voltage Ddd and the drain of the NMOS transistor M32 is connected to the terminal T4.

In addition, the sources of the NMOS transistors M31 and M32 are interconnected and the junction of these gates is connected to the drain of NMOS transistor M25.

The PMOS transistor M3 serves as the transistor configured to supply the bias current to the PMOS transistors M5 and M6 as the differential pair, and the drain current of the PMOS transistor M3 is used as the bias current.

As described earlier, the PMOS transistors M1 and M3 are configured to form a first current mirror circuit. As a result, a drain current id1 of the PMOS transistor M1 is proportional to the abovementioned bias current.

The drain current id1 of the PMOS transistor M1 is specified by the current through the resistor R1 and represented by the expression:

$$id1 = (Vdd - Vgs1)/R2 \qquad (1),$$

where Vgs1 is the voltage between the gate and source of the PMOS transistor M1.

Since the variation in the voltage Vgs1 between the gate and source of the PMOS transistor M1 is relatively small, the drain current id1 of the PMOS transistor M1 is primarily determined by the resistance of the resistor R2. That is, the bias current of the amplifier circuit 3 can be set by the resistor R2.

Incidentally, when a suitable current source is available, the current source may be used by connecting to the terminal T3 in place of the resistor R2. In this case, the drain current id1 of the PMOS transistor M1 is equated to the current value of the current source connected to the terminal T3.

Since the drain current of the NMOS transistors M8 and M9 increases with the increase in the bias current of the amplifier circuit 3; the drain currents of the NMOS transistors M7 and M10, which constitute current mirror circuits with the NMOS transistors M8 and M9, respectively, increase; and the drain current of the PMOS transistor M2, which is connected to the drain of the NMOS transistor M7, also increases.

Moreover, the drain current of the NMOS transistor M4, which constitutes the current mirror circuit with the PMOS transistor M2, increases. As a result, the current outputting capability of the amplifier circuit 3 increases.

A response time of the laser driving circuit 1 is practically determined by a settling time of the sample hold circuit 4. The settling time is, in turn, determined by the time for charging the capacitor HC, which is represented by the expression, $$T = V \times C/i \qquad (2),$$

where V is the voltage variation in, C the capacitance of, and i the charging current for the capacitor HC.

According to the expression (2), it is shown that the charging time T can be varied by changing the charging current i even with a fixed capacitance value C.

That is, since the charging time T of the capacitor HC is varied by properly setting the current outputting capability of the amplifier circuit 3 with the resistor R2, the response time of the laser driving circuit 1 can arbitrarily be adjusted.

Therefore, since the semiconductor laser driving circuit 1 according to the first embodiment is provided with the capacitor HC built-in, which is previously attached externally, the grounding of the capacitor HC can be placed within IC and in close vicinity of the ground of the voltage-to-current converter 5, a potential difference becomes less likely to be generated and an external terminal otherwise required for connecting the capacitor HC now becomes unnecessary.

As a result, the driving circuit 1 can be made less susceptible to noise interference, the voltage-to-current conversion can be achieved with higher precision, and the control of light intensity can be carried out with high accuracy.

In addition, although the capacitance of the capacitor HC has been changed previously according to the response time of the laser diode LD, the change in this manner is not feasible as a result of the capacitor HC built-in.

The change is still feasible, however, by other means such as, for example, by changing the resistance of the resistor R2 which is externally connected between the terminal T3 and the ground potential, and by changing the charging time T for the capacitor HC by changing the current outputting capability of the amplifier circuit 3, whereby the response time for LD light intensity control in the feedback control loop can suitably be adjusted.

Second Embodiment

It is noted that the laser driving circuit of the first embodiment described above is configured for the potential drop through the resistor R1 to change with the photocurrent outputted from the photodiode PD.

In the PN junction region of the photodiode PD, however, there exists a junction capacitance and a parasitic capacitance along the wiring from the anode of photodiode PD to the terminal T1.

Since these capacitances are subjected to charge and discharge with photocurrent im outputted from the photodiode PD, it takes time to charge/discharge in the case of small values of the photocurrent im. This results in a considerable decrease in the response speed.

This difficulty can be obviated by retaining a terminal voltage of photodiode PD unchanged even after the change of the photocurrent im, and by providing a detection circuit configured to amplify the photocurrent im so as to be manageable, which will be detailed herein below as a second embodiment of the invention.

Figure 3:
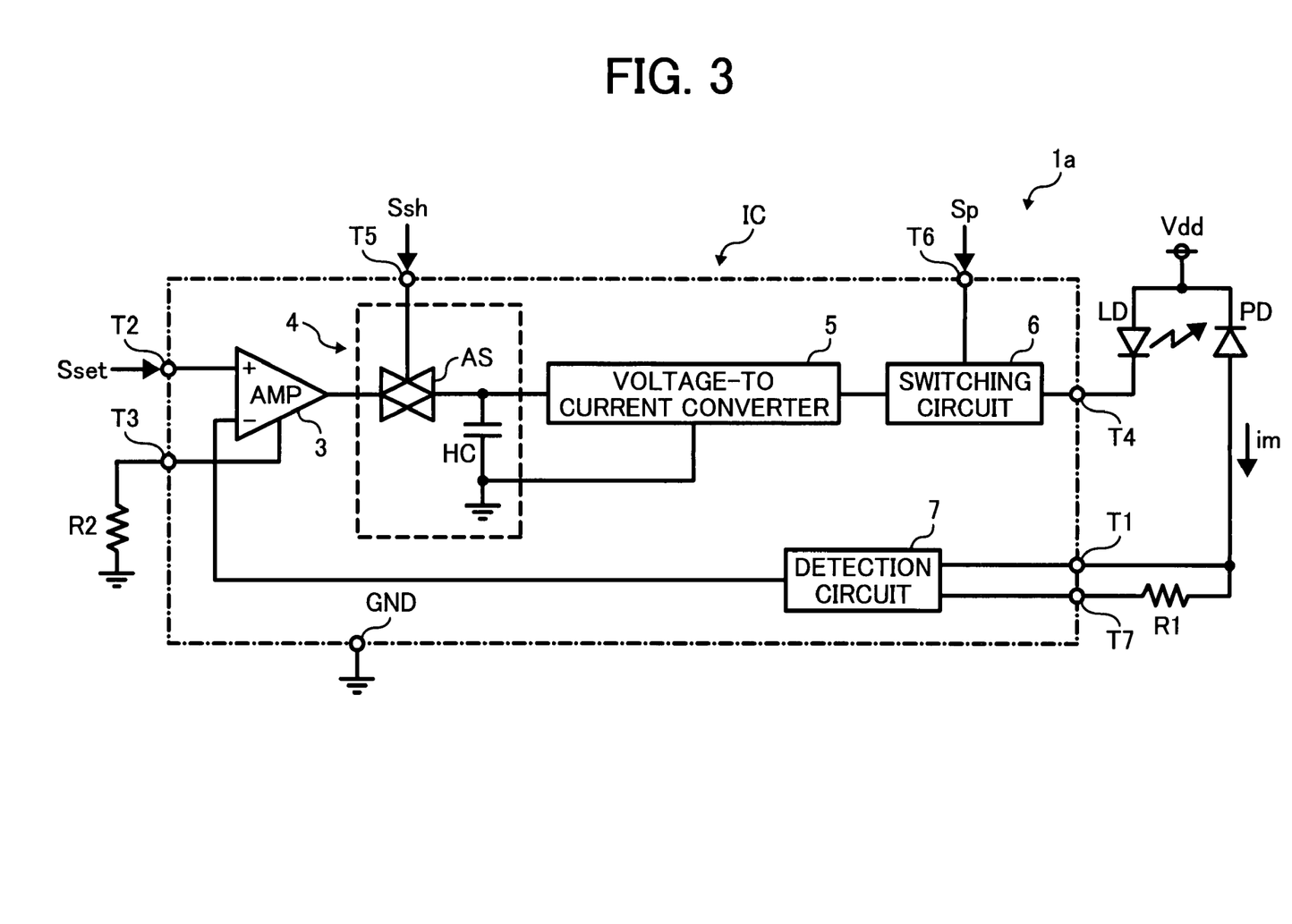
FIG. 3 is a diagrammatic block diagram illustrating the configuration of a semiconductor laser driving circuit according to another embodiment of the invention.

FIG. 3 is a diagrammatic block diagram illustrating the configuration of a semiconductor laser driving circuit according to a second embodiment of the invention.

The device components included in FIG. 3 that are similar to those in FIG. 1 are shown with identical numerical representations, and the description thereof is herein abbreviated for purposes of clarity.

Referring to FIG. 3, the laser driving circuit according to the second embodiment has a configuration similar to FIG. 1 with the exception that a terminal voltage of photodiode PD is configured to be unchanged even after the change of the photocurrent im, and that a detection circuit 7 is included to be capable of amplifying the photocurrent im to be manageable.

The laser driving circuit 1a according to the second embodiment is therefore configured to drive a laser diode LD such that the intensity of light emitted therefrom reaches a predetermined value.

The semiconductor laser driving circuit 1a includes at least a photodiode PD, an amplifier circuit 3, a sample hold circuit 4, a voltage-to-current converter 5, a switching circuit 6, a detection circuit 7, and resistors R1 and R2.

In addition, the amplifier circuit 3, sample hold circuit 4, voltage-to-current converter 5, switching circuit 6, and detection circuit 7 are all integrated into one single IC.

The anode of the photodiode PD is connected to one input terminal of the detection circuit 7 by way of the terminal T1, and to the other terminal thereof by way of the resistor R1 and the terminal T7.

The output terminal of the detection circuit 7 is connected to the non-inverting terminal of the amplifier circuit 3. In addition, a light intensity setting signal Sset is inputted to the non-inverting terminal of the amplifier circuit 3 by way of the terminal T2.

Figure 4:
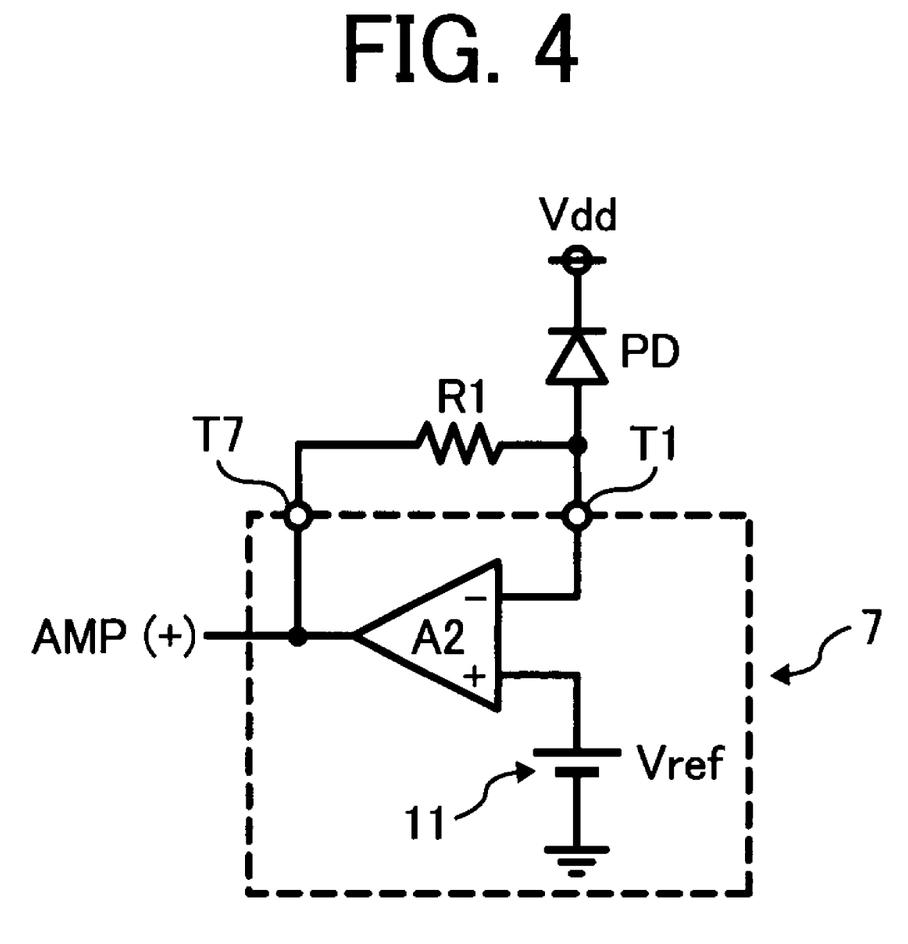
FIG. 4 illustrates certain construction details of the detection circuit 7 of FIG. 3.

FIG. 4 illustrates certain construction details of the detection circuit 7 of FIG. 3.

Referring to FIG. 4, the detection circuit 7 includes an operational amplifier A2, and a reference voltage generator 11 for generating and outputting a predetermined reference voltage Vref.

In the operational amplifier A2, the inverting terminal thereof is connected to the terminal T1, the non-inverting terminal is inputted with the predetermined reference voltage Vref, and the output terminal is connected to the non-inverting terminal of the amplifier circuit 3.

Since the terminal voltage of photodiode PD remains unchanged even after the change of the photocurrent im, the time for charging the photodiode PD becomes unnecessary. Although the voltage of the terminal T7 changes, the process of charging the parasitic capacitance in this portion is carried out with an output current from the operational amplifier A2.

If an output current from the operational amplifier A2 is large enough compared with the photocurrent im, the response speed of the photodiode PD can be increased.

Incidentally, in the case of FIG. 4 where the detection circuit 7 is used, the light intensity setting signal Sset to be inputted to the terminal T2 of FIG. 3 is not based on the ground potential but may be switched to the signal based on the reference voltage Vref, preferably with the voltage of the light intensity setting signal Sset smaller than reference voltage Vref.

As described herein above, the semiconductor laser driving circuit according to the second embodiment is formed, based on the laser driving circuit of the first embodiment, by additionally devising the terminal voltage of photodiode PD to remain unchanged even after the change of the photocurrent im, and providing the detection circuit 7 configured to amplify the photocurrent im to be manageable for the driving circuit.

As a result, in addition to the aforementioned capabilities of the driving circuit according to the first embodiment, the semiconductor laser driving circuit according to the second embodiment is provided with the additional feature of increased response speed with respect to the light intensity variation of the laser diode LD.

It is apparent from the above description including the example disclosed that the semiconductor laser driving circuit of the invention can offer several advantages over similar laser driving circuits previously known.

For example, the capacitor HC included in the sample hold circuit, which is previously attached externally, is now provided as built-in, and the grounding of the capacitor HC can be placed within IC and in close vicinity of the ground of the voltage-to-current converter 5, accordingly. The potential difference between the grounding point and surrounding circuits becomes less likely to be generated, and an external terminal otherwise required for connecting the capacitor HC is now unnecessary.

As a result, the laser driving circuit can be made less susceptible to noise interference, the voltage-to-current conversion can be achieved with higher precision, and the control of light intensity can be achieved with high accuracy.

In addition, the aforementioned current outputting capability for charging the capacitor HC included in the sample hold circuit can variably be adjusted by either the resistor or current source, which is externally connected, and the response time of the laser driving circuit can be adjusted arbitrarily.

Moreover, the terminal voltage of photodiode is configured to remain unchanged to be equal to a reference voltage even after the change of the photocurrent, and the voltage outputted from the current-to-voltage converter is adjusted based on the reference voltage.

As a result, the response speed of the photodiode can be increased in the semiconductor laser driving circuit according to the present invention.

The process steps set forth in the present description on driving circuits for controlling the light intensity of semiconductor laser diode may be implemented using conventional general purpose microprocessors, programmed according to the teachings in the present specification, as will be appreciated to those skilled in the relevant arts. Appropriate software coding can readily be prepared by skilled programmers based on the teachings of the present disclosure, as will also be apparent to those skilled in the relevant arts.

The present specification thus include also a computer-based product which may be hosted on a storage medium, and include instructions which can be used to program a microprocessor to perform a process in accordance with the present disclosure. This storage medium can include, but not limited to, any type of disc including floppy discs, optical discs, CD-ROMs, magneto-optical discs, ROMs, RAMs, EPROMs, EEPROMs, flash memory, magnetic or optical cards, or any type of media suitable for storing electronic instructions.

While the invention has been described in conjunction with the preferred embodiments, including specific components, units and configurations, it is evident that many alternatives and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed as new and desired to be protected by Letters Patent of the United States is:

1. A semiconductor laser driving circuit configured to perform at least a first operation to convert a laser light emitted from a semiconductor laser into a first electrical current by a light receiving element; a second operation to control a second electrical current supplied to said semiconductor laser such that a first voltage corresponding to said first electrical current reaches a predetermined voltage; and a third operation to drive said semiconductor laser by controlling said first voltage such that a first light intensity reaches a predetermined light intensity, a single integrated circuit comprising the semiconductor laser driving circuit, said integrated circuit comprising:
    an amplifier circuit configured to amplify a voltage difference between said first voltage and a light intensity setting signal inputted from outside for setting a second light intensity of said semiconductor laser, said amplifier circuit comprising:
        a first transistor and a second transistor forming a differential pair having interconnected sources, a gate of the first transistor for receiving the light intensity setting signal inputted from outside and a gate of the second transistor for receiving the first voltage;
        a third transistor and a fourth transistor forming a current mirror, a drain of the fourth transistor being connected to the sources of the first and second transistors and the sources of the third and fourth transistors configured to be connected to a voltage source;
    a sample hold circuit configured to hold a first output voltage from said amplifier circuit according to a first control signal inputted from outside;
    a voltage-to-current converter, configured to convert a second output voltage from said sample hold circuit into a third electrical current, connected to an internal ground of said integrated circuit; and
    a switching circuit configured to perform a supply control of said third electrical current to said semiconductor laser according to a second control signal inputted from outside,
    wherein said sample hold circuit comprises a capacitor, connected to said internal ground, configured to hold a fourth electrical current charged by a third output voltage outputted from said amplifier circuit,
    wherein said amplifier circuit adjusts a charging time of said capacitor according to a preset value and a response speed of a feedback control loop of said laser driving circuit, and
    wherein said integrated circuit has an external terminal for connection to an external ground.

2. The semiconductor laser driving circuit according to claim 1, wherein the current outputting capability of said amplifier circuit is set by adjustably changing a bias current.

3. The semiconductor laser driving circuit according to claim 2, further comprising:
    a current-to-voltage converter configured to convert said first electrical current from said light receiving element into a second voltage and to output said second voltage to said amplifier circuit, wherein said light receiving element is a photodiode configured to output said first electrical current according to a light intensity received by said photodiode.

4. The semiconductor laser driving circuit according to claim 3, further comprising:
    a detection circuit configured to detect said first electrical current such that a terminal voltage of said photodiode remains at a predetermined value even after a change of said first electrical current and such that said second voltage outputted by said current-to-voltage converter is brought to be equal to a voltage based on said predetermined value.

5. The semiconductor laser driving circuit according to claim 1, further comprising:
    a current-to-voltage converter configured to convert said first electrical current from said light receiving element into a second voltage and to output said second voltage to said amplifier circuit, wherein said light receiving element is a photodiode configured to output said first electrical current according to a light intensity received by said photodiode.

6. The semiconductor laser driving circuit according to claim 2, wherein said amplifier circuit, said sample hold circuit, said voltage-to-current converter, and said switching circuit are all integrated into a first integrated circuit, and wherein said first integrated circuit is provided with a setting terminal for accepting a setting of said bias current such that said bias current is variably adjusted according to a resistance of a resistor externally connected to said setting terminal.

7. The semiconductor laser driving circuit according to claim 2, wherein said amplifier circuit, said sample hold circuit, said voltage-to-current converter, and said switching circuit are all integrated into a first integrated circuit, and wherein said first integrated circuit is provided with a setting terminal for accepting a setting of said bias current such that said bias current is variably adjusted according to an electrical current supplied by a current source externally connected to said setting terminal.

8. The semiconductor laser driving circuit according to claim 4, wherein said integrated circuit is provided with a setting terminal for accepting a setting of said bias current such that said bias current is variably adjusted according to a resistance of a resistor externally connected to said setting terminal.

9. The semiconductor laser driving circuit according to claim 4, wherein said integrated circuit is provided with a setting terminal for accepting a setting of said bias current such that said bias current is variably adjusted according to an electrical current supplied by a current source externally connected to said setting terminal.

10. A semiconductor laser driving circuit configured to perform at least a first operation to convert a laser light emitted from a semiconductor laser into a first electrical current by a light receiving element; a second operation to control a second electrical current supplied to said semiconductor laser such that a first voltage corresponding to said first electrical current reaches a predetermined voltage; and a third operation to drive said semiconductor laser by controlling said first voltage such that a first light intensity reaches a predetermined light intensity, a single integrated circuit comprising the semiconductor laser driving circuit, said integrated circuit comprising:

amplifier means for amplifying a voltage difference between said first voltage and a light intensity setting signal inputted from outside for setting a second light intensity of said semiconductor laser, said amplifier means comprising:

a first transistor and a second transistor forming a differential pair having interconnected sources, a gate of the first transistor for receiving the light intensity setting signal inputted from outside and a gate of the second transistor for receiving the first voltage;

a third transistor and a fourth transistor forming a current mirror, a drain of the fourth transistor being connected to the sources of the first and second transistors and the sources of the third and fourth transistors configured to be connected to a voltage source;

sample hold means for holding a first output voltage from said amplifier means according to a first control signal inputted from outside;

voltage-to-current converter means, for converting a second output voltage from said sample hold means into a third electrical current, connect to an internal ground; and switching means for performing a supply control of said third electrical current to said semiconductor laser according to a second control signal inputted from outside, wherein said sample hold means comprises a capacitor, connected to said internal ground of said integrated circuit, configured to hold a fourth electrical current charged by a third output voltage from said amplifier means, wherein said amplifier circuit adjusts a charging time of said capacitor according to a preset value and a response speed of a feedback control loop of said laser driving circuit, and wherein said integrated circuit has an external terminal for connection to an external ground.

11. The semiconductor laser driving circuit according to claim 10, wherein the current outputting capability of said amplifier means is set by adjustably changing a bias current.

12. The semiconductor laser driving circuit according to claim 11, further comprising:

current-to-voltage converter means for converting said first electrical current from said light receiving element into a second voltage and outputting said second voltage to said amplifier means, wherein said light receiving element is a photodiode configured to output said first electrical current according to a light intensity received by said photodiode.

13. The semiconductor laser driving circuit according to claim 12, further comprising:

detection means for detecting said first electrical current such that a terminal voltage of said photodiode remains a predetermined value even after a change of said first electrical current and such that said second voltage outputted by said current-to-voltage means is brought to be equal to a voltage based on said predetermined value.

* * * * *